United States Patent
Moriyama

(10) Patent No.: US 12,129,403 B2
(45) Date of Patent: Oct. 29, 2024

(54) POLISHING COMPOSITION

(71) Applicant: NITTA DuPont Incorporated, Osaka (JP)

(72) Inventor: Kazuki Moriyama, Kyoto (JP)

(73) Assignee: NITTA DUPONT INCORPORATED, Osaka (JP)

( * ) Notice: Subject to any disclaimer, the term of this patent is extended or adjusted under 35 U.S.C. 154(b) by 1013 days.

(21) Appl. No.: 16/977,837

(22) PCT Filed: Feb. 28, 2019

(86) PCT No.: PCT/JP2019/007787
§ 371 (c)(1),
(2) Date: Sep. 3, 2020

(87) PCT Pub. No.: WO2019/176558
PCT Pub. Date: Sep. 19, 2019

(65) Prior Publication Data
US 2021/0024779 A1 Jan. 28, 2021

(30) Foreign Application Priority Data
Mar. 15, 2018 (JP) ................... 2018-048058

(51) Int. Cl.
*C09G 1/02* (2006.01)
*C01F 7/02* (2022.01)

(52) U.S. Cl.
CPC . *C09G 1/02* (2013.01); *C01F 7/02* (2013.01)

(58) Field of Classification Search
CPC .................................. C09G 1/02; C07F 1/02
See application file for complete search history.

(56) References Cited

U.S. PATENT DOCUMENTS

| | | | | |
|---|---|---|---|---|
| 5,076,955 A | * | 12/1991 | Ussat | C11D 3/2079 510/238 |
| 6,440,187 B1 | * | 8/2002 | Kasai | C01F 7/448 106/3 |
| 6,475,407 B2 | * | 11/2002 | Ono | C09G 1/02 438/692 |
| 2001/0055558 A1 | | 12/2001 | Kogoi et al. | |
| 2003/0064020 A1 | | 4/2003 | Kogoi et al. | |
| 2006/0194885 A1 | | 8/2006 | Kogoi et al. | |
| 2011/0258938 A1 | | 10/2011 | Morinaga et al. | |
| 2015/0322294 A1 | | 11/2015 | Onishi | |
| 2019/0010357 A1 | | 1/2019 | Kamada et al. | |

FOREIGN PATENT DOCUMENTS

| | | |
|---|---|---|
| CN | 1414925 | 4/2003 |
| CN | 107735478 | 2/2018 |
| JP | 2000-028819 | 1/2000 |
| JP | 2004-022748 | 1/2004 |
| JP | 2009-129977 | 6/2009 |
| JP | 2015-090922 | 5/2015 |
| KR | 10 2004 0052355 | 6/2004 |
| TW | 201430115 | 8/2014 |
| WO | 2009/151120 | 12/2009 |
| WO | 2016/208301 | 12/2016 |

\* cited by examiner

*Primary Examiner* — Alexandra M Moore
(74) *Attorney, Agent, or Firm* — Bauer & Joseph

(57) ABSTRACT

A polishing composition is for polishing a resin, and includes alumina abrasive grains, a dispersant, and water. A ratio between a primary average particle size of alumina particles in the alumina abrasive grains and an average particle size of the alumina particles measured by dynamic light scattering is 1:6.0 to 1:100.

3 Claims, 1 Drawing Sheet

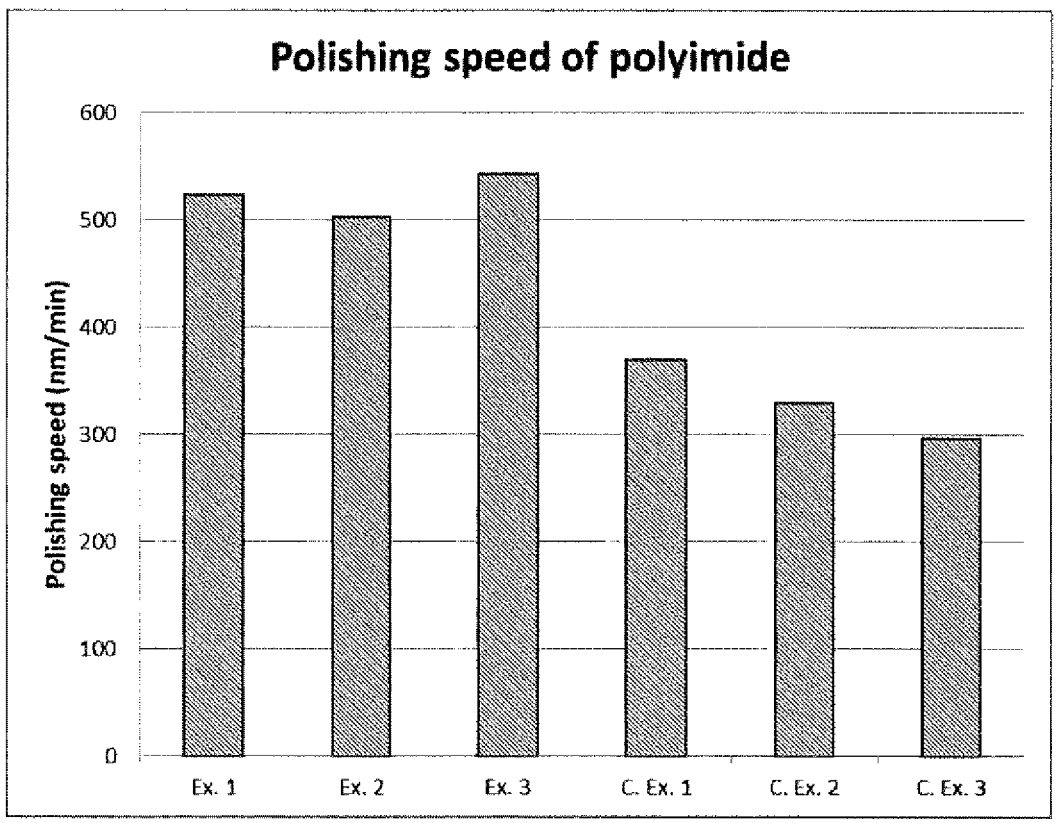

POLISHING COMPOSITION

CROSS-REFERENCE TO RELATED APPLICATION

This application claims priority to Japanese Patent Application No. 2018-048058, the disclosure of which is incorporated herein by reference in its entirety.

FIELD

The present invention relates to a polishing composition.

BACKGROUND

In recent years, miniaturization and high integration of printed circuit boards, module boards, package boards or the like have progressed the development of minuter and higher-density wiring. Wires are overlaid into a number of layers to form an irregular profile, which needs to be removed by polishing into a flat profile.

Conventionally, in a printed circuit board or the like, wires formed of copper or a copper alloy are layered on an insulating substrate formed of a resin to form a conductive layer. Known as a polishing composition for polishing copper or the copper alloy is, for example, a polishing composition including abrasive grains such as colloidal silica, a copper complexing agent, alkylbenzenesulfonic acid triethanolamine, and water (Patent Literature 1).

CITATION LIST

Patent Literature

Patent Literature 1: JP 2015-090922 A

SUMMARY

Technical Problem

Recently, there has been a demand for polishing the resin constituting the insulating substrate at the time of polishing the printed circuit board or the like. In particular, it has been demanded to polish the resin at a high polishing speed. Conventionally, however, increasing the particle size of abrasive grains included in the polishing composition to increase the polishing speed has a problem of causing the abrasive grains to precipitate in the polishing composition. Thus, the polishing composition cannot be uniformly supplied on a polishing pad.

The present invention has been conceived in view of such circumstances, and it is therefore an object of the present invention to provide a polishing composition capable of suppressing precipitation of abrasive grains and increasing a polishing speed for a resin.

Solution to Problem

The present inventors have found that, when a polishing composition including alumina abrasive grains, a dispersant, and water is used to polish a resin, a ratio between a primary average particle size of alumina particles in the alumina abrasive grains and an average particle size of the alumina abrasive grains measured by dynamic light scattering falls within a specific range so that the abrasive grains can be suppressed from precipitating and the polishing speed for the resin can be increased. The summary of the present invention is provided below.

The polishing composition according to the present invention is for polishing a resin, and includes: alumina abrasive grains; a dispersant; and water, wherein a ratio between a primary average particle size of alumina particles in the alumina abrasive grains and an average particle size of the alumina particles measured by dynamic light scattering is 1:6.0 to 1:100.

In the polishing composition according to the present invention, the dispersant is preferably a surfactant.

In the polishing composition according to the present invention, the surfactant is preferably an alkylbenzenesulfonate.

BRIEF DESCRIPTION OF DRAWINGS

FIG. 1 is a graph showing the polishing speed for polyimide when polished using a polishing composition of each of Examples and Comparative Examples.

DESCRIPTION OF EMBODIMENTS

Hereinafter, a polishing composition according to an embodiment of the present invention will be described.
<Polishing Composition>

The polishing composition according to the embodiment of the present invention includes alumina abrasive grains, a dispersant, and water.

(Alumina Abrasive Grains)

The polishing composition according to this embodiment includes alumina abrasive grains. The alumina abrasive grains are not particularly limited, and may be appropriately selected from various known kinds of alumina particles for use. Examples of such known kinds of alumina particles include α-alumina, γ-alumina, δ-alumina, θ-alumina, η-alumina, κ-alumina, and χ-alumina. The examples of the known kinds of alumina particles further include alumina called fumed alumina (typically alumina fine particles produced when alumina salt is calcined at a high temperature), and alumina called colloidal alumina or alumina sol (for example an alumina hydrate such as boehmite), based on classification according to production methods. These kinds of alumina particles may be individually used, or two or more of them may be used in combination.

The content of the alumina abrasive grains in the polishing composition is preferably 0.3 mass % or more, and preferably 5.0 mass % or less. When the content of the alumina abrasive grains falls within the above range, it is possible to suppress a decrease in storage stability while maintaining a high polishing capability. The content of the alumina abrasive grains is more preferably 1.0 mass % or more, and more preferably 3.0 mass % or less. In the case where two or more kinds of the alumina abrasive grains are included, the content of the alumina abrasive grains shall be the total content of the two or more kinds of the alumina abrasive grains.

In the polishing composition according to this embodiment, a ratio between a primary average particle size of alumina particles in the alumina abrasive grains and an average particle size of the alumina particles measured by dynamic light scattering is 1:6.0 to 1:100, preferably 1:10 to 1:50.

In the polishing composition, a dispersant to be described later is adsorbed on surfaces of the alumina particles in the alumina abrasive grains, whereby the alumina particles form clusters. In the polishing composition, the ratio between the primary average particle size of the alumina particles in the alumina abrasive grains and the average particle size of the alumina particles measured by dynamic light scattering (that is, alumina particles formed into clusters) falls within the aforementioned range so that dispersibility of the alumina abrasive grains can be improved and precipitation of the alumina abrasive grains can be suppressed. As a result, the polishing composition can be uniformly supplied on the polishing pad. Further, the average particle size of the alumina particles in the polishing composition can be made larger than the primary average particle size of these alumina particles so that the polishing speed for the resin can be increased.

(Dispersant)

The polishing composition according to this embodiment includes a dispersant.

Examples of the dispersant include a surfactant, a polymer compound, and a phosphate. Among these, the dispersant is preferably a surfactant. When the dispersant is a surfactant, the surfactant is adsorbed on the surfaces of the alumina particles to more improve dispersibility of the alumina abrasive grains. As a result, the precipitation of the alumina abrasive grains can be more suppressed. Further, the absorption of the surfactant on the surfaces of the alumina abrasive grains allows the average particle size of the alumina particles in the polishing composition to be larger than the primary average particle size of these alumina particles, to thereby more increase the polishing speed for the resin. These dispersants may be individually used, or two or more kinds of them may be used in combination.

Examples of the surfactant include anionic surfactants such as a polyacrylic acid, an alkylbenzenesulfonic acid, an alkanesulfonic acid, an α-olefinsulfonic acid, an alkyl ether carboxylic acid, an alkyl sulfonic acid, and salts thereof, as well as an alkyl sulfate ester salt. Among these, the surfactant is preferably an alkylbenzenesulfonate. When the surfactant is an alkylbenzenesulfonate, the alkylbenzenesulfonate is adsorbed on the surfaces of the alumina particles to more improve dispersibility of the alumina abrasive grains. As a result, the precipitation of the alumina abrasive grains can be more suppressed. Further, the absorption of the alkylbenzenesulfonate on the surfaces of the alumina abrasive grains allows the average particle size of the alumina particles in the polishing composition to be larger than the primary average particle size of these alumina particles, to thereby more increase the polishing speed for the resin. These surfactants may be individually used, or two or more kinds of them may be used in combination.

Examples of the alkylbenzenesulfonic acid include alkylbenzenesulfonic acids from C6 to C20, specifically a decylbenzenesulfonic acid, a undecylbenzenesulfonic acid, a dodecylbenzenesulfonic acid, a tridecylbenzenesulfonic acid, and a tetradecylbenzenesulfonic acid. Among these, the alkylbenzenesulfonic acid is preferably a dodecylbenzenesulfonic acid in terms of suppressing the precipitation of the alumina abrasive grains and increasing the polishing speed for the resin. Further, examples of the alkylbenzenesulfonate include sodium alkylbenzenesulfonate and alkylbenzenesulfonic acid triethanolamine.

The content of the dispersant in the polishing composition is preferably 0.3 mass % or more, more preferably 0.5 mass % or more, and is preferably 3.0 mass % or less, more preferably 1.5 mass % or less, in terms of improving dispersibility of the alumina abrasive grains. In the case where two or more dispersants are included, the content of the dispersant shall be the total content of the dispersants.

(Water)

In the polishing composition according to this embodiment, the alumina abrasive grains, glycine and the surfactant are dissolved or suspended in water. It is preferable that the water including few impurities, such as ion exchange water, be used so as not to inhibit various actions of the alumina abrasive grains, the glycine, and the surfactant.

(pH Adjuster)

It is preferable that the polishing composition according to this embodiment have a pH of 7.0 or more and 11.0 or less. This configuration can improve the mechanical polishing power for a resin and increase the polishing speed for the resin. In order to adjust the pH within the above range, the polishing composition according to this embodiment may include a pH adjuster as required. Examples of the pH adjuster include: an acid such as an organic acid or an inorganic acid (e.g., the organic acid such as glycine, malonic acid, malic acid, tartaric acid, or aspartic acid, or the inorganic acid such as nitric acid or hydrochloric acid); an inorganic base such as ammonia or KOH; and an organic base such as tetramethylammonium hydroxide (TMAH).

(Defoamer)

The polishing composition according to this embodiment may include a defoamer as required. This configuration allows foaming of the polishing composition to be suppressed and allows a resin to be more uniformly polished. Examples of the defoamer include a silicone emulsion and a nonionic surfactant. The content of the defoamer in the polishing composition is preferably 0.05 mass % or more, and preferably 0.3 mass % or less.

The polishing composition according to the present invention is not limited to the abovementioned embodiment. Further, the polishing composition according to the present invention is not limited to the abovementioned operational effects, either. Various modifications can be made to the polishing composition according to the present invention without departing from the gist of the present invention.

<Polishing Object>

The polishing composition according to the present embodiment is for polishing a resin. Examples of the resin include an epoxy resin, a phenol resin, and a polyimide resin.

Examples of the polishing object to be polished with the polishing composition according to this embodiment include a printed circuit board, a module board, and a package board, which include the resin.

EXAMPLES

Hereinafter, examples of the present invention will be described. However, the present invention is not limited to the following examples.

<Preparation of Polishing Composition>

The polishing compositions of Examples and Comparative Examples having the respective compositions shown in Table 1 were prepared. Details of each component are shown below:

Alumina abrasive grains: A9225 (manufactured by Saint-Gobain K.K.), primary average particle size=40.3 nm
LAS: triethanolamine dodecylbenzenesulfonate (manufactured by TOHO Chemical Industry Co., Ltd.)
KOH: manufactured by TOAGOSEI CO., LTD.
Glycine: manufactured by FUSO CHEMICAL CO., LTD.
Silicone-based defoamer: silicone emulsion (manufactured by SENKA corporation)
Water: ion-exchanged water <Measurement of pH>

The pH of the polishing composition of each of Examples and Comparative Examples was measured using a pH meter.

<Primary Average Particle Size of Alumina Particles>

The primary particle size of the alumina particles was calculated by the formula (i) below, assuming that the particles were spherical. In the formula (i) below, the density of alumina was set to 4 g/cm³.

$$d = 6/\rho S \quad (i)$$

d: Primary particle size (μm)
ρ: Density of alumina (g/cm³)
S: Specific surface area (m²/g)

The specific surface area in the above formula (i) was measured by the nitrogen gas adsorption method (BET method) using a specific surface area and pore size analyzer QUADRASORB evo (manufactured by Quantachrome Co.). Used as the alumina abrasive grains was alumina slurry that was subjected to vacuum drying at 85° C. for 24 hours. Detailed conditions are given below.

Pretreatment: The alumina abrasive grains were placed in a measurement cell and subjected to vacuum degassing at 85° C. for 2 hours.
Principle of measurement: Constant volume method
Adsorbed gas: nitrogen gas
Measurement temperature: 77.35 K (−195.8° C.)
Cell size: Small cell 1.5 cm³ (outer stem diameter of 9 mm)
Measurement items: Several points on the adsorption side of $P/P_0 = 0$ to 0.3
Analysis Item: Specific surface area by multipoint BET method The specific surface area was measured twice for the same alumina abrasive grain by the method above, and the average value of the primary particle size obtained by the above formula (i) from the respective specific surface area values was defined as the primary average particle size.

<Measurement of Average Particle Size of Alumina Particles>

The average particle size of the alumina particles was measured by dynamic light scattering using the zeta potential/grain size measurement system ELSZ-2 (manufactured by Otsuka Electronics Co., Ltd.). The obtained particle size in which the cumulative volume frequency of the volume particle size distribution was 50% was defined as the average particle size of the alumina particle size. The measurement was performed by filling the measurement cell with the alumina slurry diluted by a factor of 100 with ultrapure water. As the laser, a semiconductor laser was used. The average particle size of the alumina particles and the ratio between the primary average particle size and the average particle size of the alumina particles are shown in Table 1.

Since the alumina abrasive grains precipitated in the polishing compositions of Comparative Examples 2 and 3, the average particle size of the alumina particles could not be measured.

<Measurement of Polishing Speed>

Using the polishing composition of each of Examples and Comparative Examples, a polishing object was polished under the following conditions to obtain the polishing speed. The results are shown in Table 1 and FIG. 1.

Polishing object: polyimide (deposited on silicon wafers)
Polisher: FREX (manufactured by EBARA CORPORATION)
Polishing pressure: 3 psi
Slurry flow rate: 300 mL/min
Platen rotation speed/carrier rotation speed: 103 rpm/97 rpm
Polishing time: 1 minute
Polishing pad: IC1000 (Nitta Haas Incorporated)

<Evaluation of Dispersion Stability>

100 ml of the polishing composition of each of Examples and Comparative Examples was put in a plastic container having a transparent or translucent side wall and was sufficiently stirred therein, followed by being allowed to stand at room temperature for 10 minutes to obtain a slurry of each polishing composition. Then, the slurry was visually observed to evaluate its dispersion stability. The evaluation criteria are as follows. The evaluated results are shown in Table 1.

○: It is not observed that the abrasive grains are precipitated in the lower part of the container.
x: It is observed that the abrasive grains are being precipitated in the lower part of the container.

TABLE 1

| | | | Ex. 1 | Ex. 2 | Ex. 3 | C. Ex. 1 | C. Ex. 2 | C. Ex. 3 |
|---|---|---|---|---|---|---|---|---|
| Composition (mass %) | Alumina abrasive grains | | 2.0 | 2.0 | 2.0 | 2.0 | 2.0 | 2.0 |
| | Dispersant | LAS | 0.5 | 1.0 | 1.5 | — | — | — |
| | pH adjuster | KOH | 0.1 | 0.1 | 0.1 | 0.1 | 0.1 | 0.1 |
| | | Glycine | 0.3 | 0.3 | 0.3 | — | 0.3 | 0.3 |
| | Defoamer | Silicone-based | 0.1 | 0.1 | 0.1 | — | — | 0.1 |
| | Water | | Balance | Balance | Balance | Balance | Balance | Balance |
| pH | | | 9.2 | 9.2 | 9.2 | 12.5 | 9.7 | 9.7 |
| Alumina particles | Average particle size (nm) | | 403.8 | 605.6 | 774.6 | 207.6 | — | — |
| | primary ave. particle size: Ave. particle size | | 1:10:0 | 1:15:0 | 1:19:2 | 1:5:2 | — | — |
| Polishing speed of polyimide (nm/min) | | | 523 | 502 | 542 | 370 | 329 | 297 |
| Dispersion stability | | | ○ | ○ | ○ | ○ | x | x |

As shown in Table 1, the polishing compositions of Examples 1 to 3, which meet all the requirements of the present invention were capable of suppressing the precipitation of the alumina abrasive grains and increasing the polishing speed for the resin.

On the other hand, the polishing composition of Comparative Example 1 neither includes any dispersant nor has a ratio between the primary average particle size and the average particle size of alumina particles satisfying the range specified in the present invention, and was therefore not capable of increasing the polishing speed for the resin.

The polishing compositions of Comparative Examples 2 and 3, which include glycine, had a lowered pH (close to the isoelectric point of alumina), and thus allowed the alumina particles to easily aggregate. However, these polishing compositions, which do not include any dispersant, caused the alumina abrasive grains to precipitate soon.

The invention claimed is:

1. A polishing composition for polishing a resin, the polishing composition comprising:
   alumina abrasive grains;
   a dispersant; and
   water, wherein
   a ratio between a primary average particle size of alumina particles calculated from a BET specific surface area in the alumina abrasive grains and an average particle size of the alumina particles measured by dynamic light scattering is 1:6.0 to 1:100, and
   a content of the alumina abrasive grains is 0.3 mass % or more and 5.0 mass % or less.

2. The polishing composition according to claim 1, wherein
   the dispersant is a surfactant.

3. The polishing composition according to claim 2, wherein
   the surfactant is an alkylbenzenesulfonate.

* * * * *